(12) United States Patent
Nakayama

(10) Patent No.: US 6,353,353 B1
(45) Date of Patent: *Mar. 5, 2002

(54) INTEGRATED SEMICONDUCTOR CIRCUIT WITH IMPROVED POWER SUPPLY CONTROL

(75) Inventor: Toshiki Nakayama, Atsugi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/000,811

(22) Filed: Dec. 30, 1997

(30) Foreign Application Priority Data

Jan. 14, 1997 (JP) .............................. 9-004418

(51) Int. Cl.⁷ .............................................. H03K 17/16
(52) U.S. Cl. ...................... 327/382; 327/112; 327/333
(58) Field of Search ................... 327/111, 112, 327/379, 380, 381, 382, 333; 307/125, 141, 141.4, 141.8, 142, 137

(56) References Cited

U.S. PATENT DOCUMENTS

| | | | | |
|---|---|---|---|---|
| 3,648,073 A | * | 3/1972 | Sams et al. ................... 307/246 |
| 4,278,918 A | * | 7/1981 | Bachofer ................... 315/169.4 |
| 4,469,958 A | * | 9/1984 | Schmitt ....................... 307/246 |
| 4,728,813 A | * | 3/1988 | Diller .......................... 307/228 |
| 5,204,554 A | | 4/1993 | Ohannes et al. .............. 326/33 |
| 5,406,215 A | * | 4/1995 | Asashina ..................... 326/27 |
| 5,563,542 A | * | 10/1996 | Watarai ....................... 327/382 |

FOREIGN PATENT DOCUMENTS

EP 197 00 988 A1 7/1997
JP 5-235275 9/1995 ........... H01L/27/04

OTHER PUBLICATIONS

Patent Abstracts of Japan, vol. 009, No. 215 (M–409), Sep. 3, 1985 & JP 60 073865 A (TOSHIBA KK), Apr. 26, 1985.
Patent Abstracts of Japan, vol. 013, No. 016 (E–703), Jan. 13, 1989 & JP 63 221712 A (MITSUBISHI ELECTRIC CORP), Sep. 14, 1988.
Patent Abstracts of Japan, vol. 013, No. 330 (E–793), Jul. 25, 1989 & JP 01 094646 A (FUJITSU LTD), Apr. 13, 1989.

* cited by examiner

*Primary Examiner*—Timothy P. Callahan
*Assistant Examiner*—Hai L. Nguyen
(74) *Attorney, Agent, or Firm*—Fitzpatrick, Cella, Harper & Scinto

(57) ABSTRACT

In order to prevent variations in a power-supply voltage caused by a parasitic inductance, a series circuit including at least one resistance and at least one capacitance is provided adjacent to a switching circuit, between a high-voltage-side interconnection and a low-voltage-side interconnection of the power-supply voltage for the switching circuit.

2 Claims, 9 Drawing Sheets

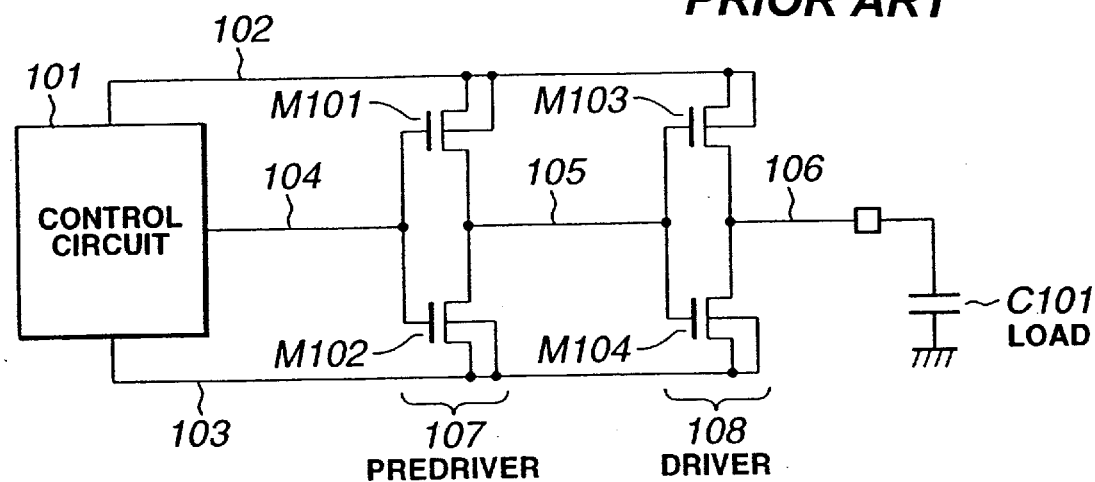
FIG.1 *PRIOR ART*
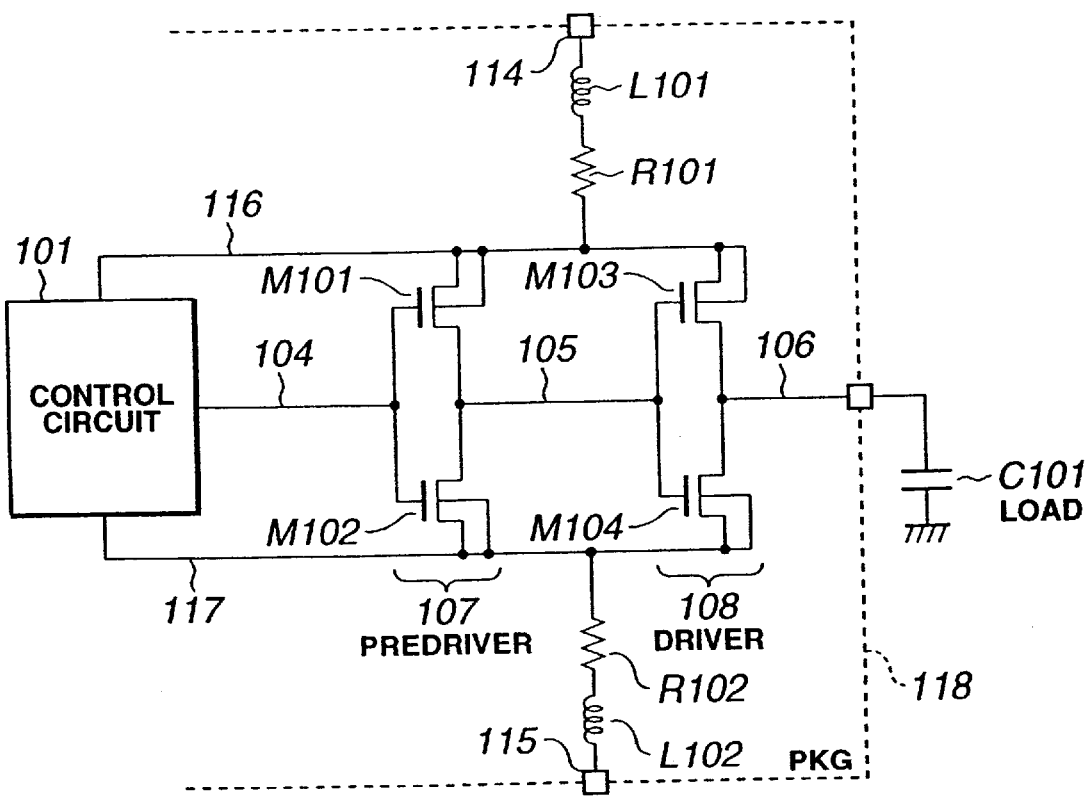
FIG.3

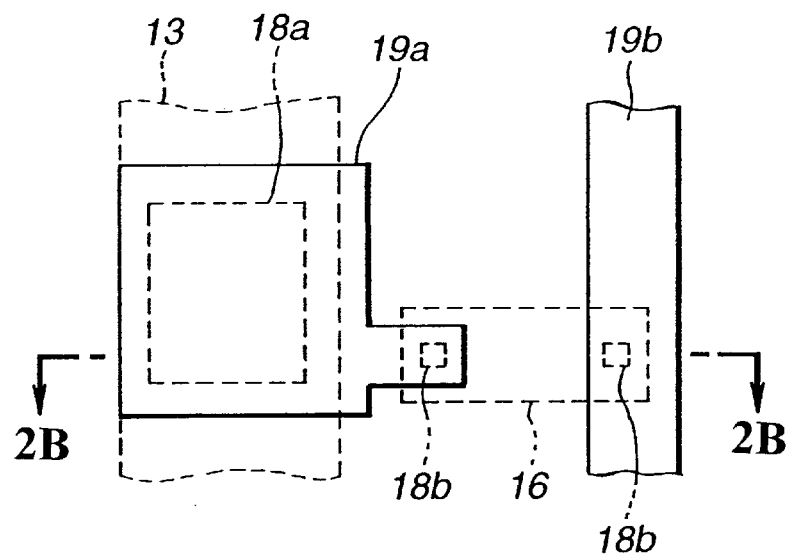
FIG.2(A)
*PRIOR ART*
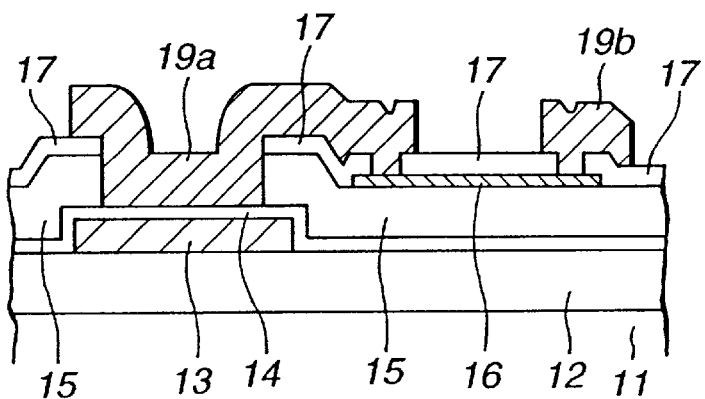
FIG.2(B)
*PRIOR ART*
FIG.5
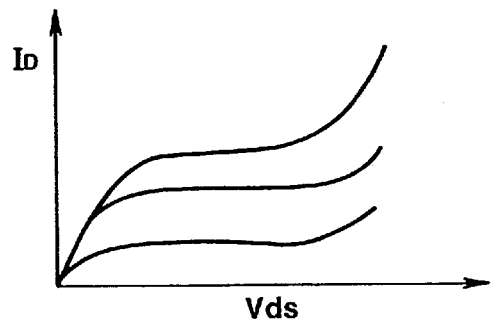

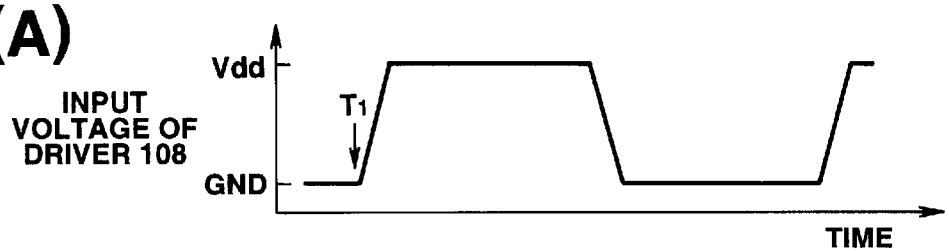
FIG.4(A) INPUT VOLTAGE OF DRIVER 108
FIG.4(B) VOLTAGES OF POWER-SUPPLY LINE 116 AND GND LINE 117
FIG.4(C) SOURCE-DRAIN VOLTAGE OF pMOS M103
FIG.4(D) SOURCE-DRAIN VOLTAGE OF nMOS M104

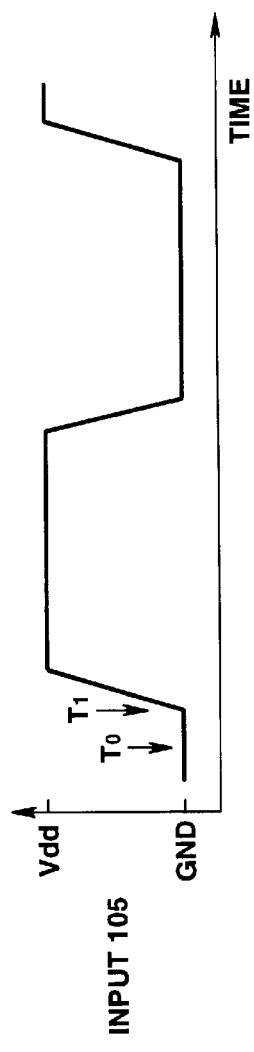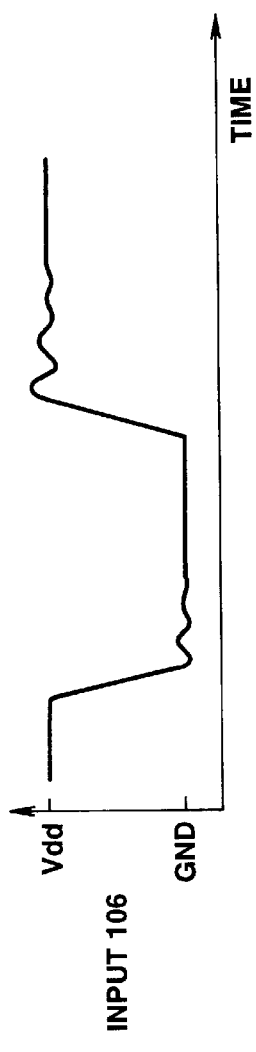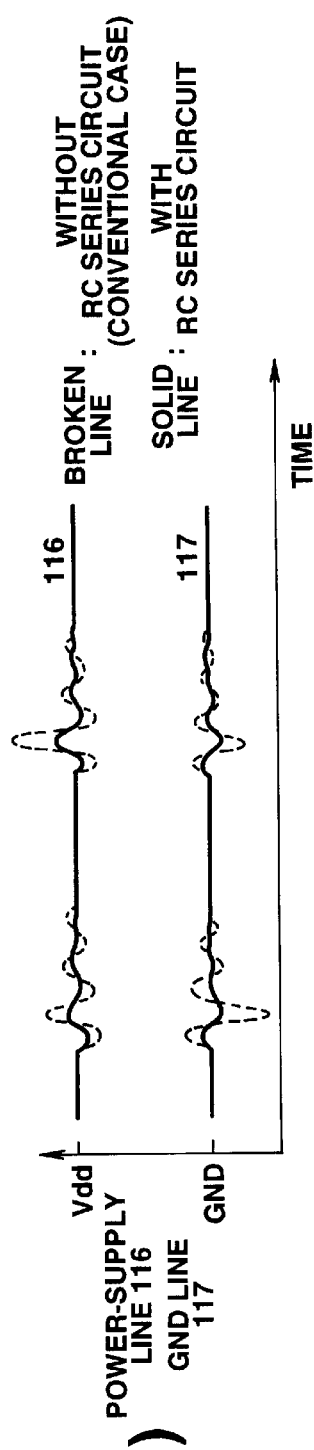

INTEGRATED SEMICONDUCTOR CIRCUIT WITH IMPROVED POWER SUPPLY CONTROL

BACKGROUND OF THE INVENTION

1. Field of the Invention

The present invention relates to a semiconductor integrated circuit, and more particularly, to a semiconductor integrated circuit including a circuit which performs high-speed and/or large-current switching, such as a driver circuit or the like.

2. Description of the Related Art

FIG. 1 illustrates a driving circuit which uses a CMOS (complementary metal oxide semiconductor) inverter. In FIG. 1, a control circuit 101 outputs a control signal 104 to a predriver 107 based on a signal from the outside or a signal within an IC (integrated circuit) including the driving circuit. The predriver 107 is an inverter comprising a pMOS transistor M101 and an nMOS transistor M102. The predriver 107 inverts the output 104 of the control circuit 101, and drives gates of a driver 108 at the final stage comprising a pMOS transistor M103 and an nMOS transistor M104. The pMOS transistor M103 and the nMOS transistor M104 constituting the driver 108 are large enough to charge/discharge a load capacitance C101 at a desired speed. There are also shown a positive power-supply line 102, a GND (ground) line 103, and an output 106. An output 105 of the predriver 107 is inverted by the driver 108 to provide the output 106. The load capacitance C101 may be the capacitance of a gate within the IC, or a load at the outside of the IC.

In Japanese Patent Laid-Open Application (Kokai) No. 5-235275 (1993), a method is proposed in which, in order to suppress noise from a power supply, a bypass capacitance is provided between power supply lines, and a thin-film resistor is connected in series in order to prevent destruction of the capacitance. This method will be described with reference to FIGS. 2(A) and 2(B). FIG. 2(A) is a schematic plan view, and FIG. 2(B) is a schematic cross-sectional view taken along line 2B—2B shown in FIG. 2(A).

In FIGS. 2(A) and 2(B), reference numeral 11 represents a silicon substrate as the one used in an ordinary silicon integrated circuit. A first field insulating layer 12 (about 500 nm thick) is formed using silicon oxide. A first conductive layer 13 (about 500 nm thick) is formed using aluminum. However, any other appropriate metal, polysilicon or the like may also be used for forming the first conductive layer 13. The first conductive layer 13 serves as a lower electrode of a capacitor, and an extended portion of the first conductive layer 13 operates as one of a set of power-supply lines (for example, a ground line). A dielectric layer 14 (about 50 nm thick) is formed using silicon nitride. A second field insulating layer 15 (about 500 nm thick) is formed using silicon oxide. A thin-film resistive layer 16 (about 10 nm thick) is formed using a thin-film SiCr-type or NiCr-type resistive material. The resistance value of this thin-film resistive layer 16 is about 1–2 kΩ. A third field insulating layer 17 (about 150 nm thick) is formed using silicon oxide. There are also shown openings for contact 18a and 18b. A second conductive layer 19a and a third conductive layer 19b (both about 1,000 nm thick) are formed using aluminum. However, any other appropriate metal, polysilicon or the like may also be used for forming these conductive layers. The second conductive layer 19a serves as an upper electrode of the capacitor, and an extended portion of the second conductive layer 19a is connected to one end of the thin-film resistive layer 16. The third conductive layer 19b is connected to the other end of the thin-film resistive layer 16, and an extended portion of the third conductive layer 19b operates as the other line of the power-supply lines (for example, a plus power-supply line).

As is apparent from the foregoing description, the first conductive layer 13, the dielectric layer 14 and the second conductive layer 19a at the opening 18a constitute a capacitor, which operates as a bypass capacitor. The capacitor and the thin-film resistive layer 16 constitute a series circuit, which is provided between the two power-supply lines (for example, between the ground line and the plus power-supply line) of the integrated circuit.

As described above, in the case shown in FIGS. 2(A) and 2(B), by providing the series circuit of the capacitance and the thin-film resistor between the power-supply lines of the integrated circuit, destruction of the coupling capacitance is prevented.

When using the driving circuit shown in FIG. 1 by forming it on a semiconductor substrate and encapsulating the IC in a package, a finite parasitic inductance is present in the package and bonding wires. Hence, when intending to perform high-speed and/or large-current switching, voltages in the power-supply line and the ground line within the IC change to apply a voltage exceeding the power-supply voltage to the transistor at the output stage, thereby, in some cases, degrading the reliability of the IC. In general, as the degree of integration of a device increases, the breakdown voltage decreases. Accordingly, when using a driving circuit as shown in FIG. 1, it is necessary to use a device of a lower degree of integration having an allowance in the breakdown voltage, thereby providing, in some cases, a disadvantage from the viewpoint of improvement in the performance and in the degree of integration.

Such a problem will now be described with reference to FIG. 3. The configuration shown in FIG. 3 is obtained by adding parasitic inductances L101 and L102 and parasitic resistances R101 and R102 caused by the package and bonding wires to the configuration shown in FIG. 1. In FIG. 3, the same components or signals as those shown in FIG. 1 are indicated by the same reference numerals, and further description thereof will be omitted.

In FIG. 3, a power-supply input terminal 114 provides the integrated circuit with a positive power supply. A power-supply input terminal 115 is connected to the ground. A positive power-supply interconnection 116 is formed on the semiconductor substrate. A ground interconnection 117 is also formed on the semiconductor substrate. A package (PKG) 118 encapsulates the integrated circuit. Changes in the power-supply lines 116 and 117 when the output 105 of the predriver changes will now be described. In a usually used package, such as a QFP (quad flat package) or the like, a parasitic inductance of about 10 nH, and a parasitic resistance of the order of 0.1 Ω are present. Accordingly, when switching a current of 500 mA in 2 nsec, the electromotive force generated in the parasitic inductance is estimated to be:

$$V = L(di/dt) = 10 \text{ nH} \times 500 \text{ mA}/2 \text{ nsec} = 2.5 \text{ V}.$$

This variation is not neglible when a power-supply voltage of about 5–10 V is used. Actually, since a greater change occurs in current at the moment of switching, a larger variation occurs in the power-supply lines. Furthermore, since variations occur in both of the positive power-supply line and the ground line, a larger voltage is applied to the device at the output stage.

FIGS. 4(A) through 4(D) illustrate variations in time in the input voltage of the driver, the power-supply voltages, and the source-drain voltages of the MOS transistors at the output stage.

FIG. 4(A) is a diagram illustrating the waveform of the input voltage of the driver 108. FIG. 4(B) is a diagram illustrating the waveforms of voltages in the power-supply line and the ground line. FIGS. 4(C) and 4(D) illustrate the source-drain voltages of the pMOS transistor M103 and the nMOS transistor M104, respectively. When the input voltage rises at a time T1 shown in FIG. 4(A), the nMOS transistor M104 is gradually turned on, so that a current flows through the driver 108 and a current as a result of discharging electric charges stored in the load C101 flows through the nMOS transistor M104. At that time, voltage drops occur in the parasitic elements L101, R101, L102 and R102 shown in FIG. 3, so that, as shown in FIG. 4(B), the voltage in the positive power-supply line decreases and the voltage in the ground line increases (at a time T2 shown in FIG. 4(B)).

This change in current generates an inverse electromotive force in the parasitic inductances L101 and L102, to increase the voltage of the positive power-supply line and to decrease the voltage of the ground line (at a time T3 shown in FIG. 4(B)).

At the rise of the input voltage, a larger change occurs in the ground line where the amount of change in current is large. On the other hand, at the fall of the input voltage, a larger change occurs in the positive power-supply line because the pMOS transistor M103 charges the load C101.

After the time T3, the change becomes oscillatory or non-oscillatory depending on the vaules of L, R and C.

When the above-described changes occur in the power-supply lines, as shown in FIGS. 4(C) and 4(D), a voltage exceeding the power-supply voltage is applied between the source and the drain of each of the MOS transistors M103 and M104 at the output stage. When this voltage exceeds the on-breakdown voltage of each of the MOS transistors M103 and M104, the drain voltage increases as indicated by static characteristics shown in FIG. 5, resulting in, in some cases, a decrease in the reliability of the device, for example, because hot carriers are injected into the gate oxide film.

In the configuration shown in FIGS. 2(A) and 2(B), variations in the power-supply lines are mitigated to some extent, to prevent destruction of the capacitance. However, in the above-described driving circuit performing high-speed and/or large-current switching and other circuits, the device is not always protected only by providing a series circuit of a coupling capacitance and a protective resistance between power-supply lines. This fact will now be explained with reference to a schematic diagram of arrangement of circuits shown in FIG. 6. In FIG. 6, there are shown a series circuit 30 of a capacitance and a thin-film resistor, other integrated circuits 31 and 32 which do not perform high-speed and/or large-current switching, a driving circuit 33 which performs high-speed and large-current switching, interconnections of a power-supply voltage 34 and 35, parasitic resistances R36–R41 caused by the power-supply interconnections, and parasitic capacitances C42–C53 caused by the power-supply interconnections. L101 and L102, and R101 and R102 are parasitic inductances and parasitic resistances, respectively, caused by the package and bonding wires. Actually, parasitic elements are distributed in the form of distributed constants. In FIG. 6, however, parasitic elements are represented by π circuits. The values of parasitic resistances and parasitic capacitances change depending on the lengths and the widths of wirings, the structure of interlayer films, and the like. In the case shown in FIG. 6, noise in the power-supply lines is mainly generated from the driving circuit 33 which performs high-speed and large-current switching. In the power supply interconnections near the circuit 31 arranged in the vicinity of the series circuit 30 of the capacitance and the thin-film resistor, variations in the power-supply lines caused by switching by the circuit 33 are small because the effect of the coupling capacitance is relatively great. However, the effect of the coupling capacitance of the series circuit 30 decreases as a device is separated from the series circuit 30, due to the influence of the parasitic elements of the power-supply lines. Accordingly, large voltages due to variations in the power-supply voltage are applied to devices constituting the driving circuit 33, and devices constituting the circuit 32 which is close to the driving circuit 33 and is separated from the series circuit 30, so that the above-described problems of destruction of the device and a decrease in the reliability of the device are, in some cases, not improved.

When using the thin-film resistor, it is necessary to add a surplus process for forming the thin-film resistor to ordinary processes for forming a C (complementary) MOS structure or bipolar transistors, resulting in an increase in the number of processes, and, in some cases, an increase in the wafer cost.

If it is intended to use a device having a sufficient margin in the breakdown voltage with respect to the power-supply voltage in order to solve the above-described problems, an advanced device of a high degree of integration cannot be used. Instead, it is necessary to use a device having inferior characteristics compared with such an advanced device because of having a long gate length, thereby causing problems such that, for example, a larger chip area is required for obtaining the same degree of driving capability, to increase the production cost, and the parasitic capacitance of the driver increases, thereby increasing power consumption.

Furthermore, variations in the power-supply lines on the semiconductor substrate may cause a misoperation in the control circuit or other circuits integrated on the same substrate. In order to solve such a problem, it is necessary to use a more complicated circuit having a better PSRR (power supply rejection ratio), resulting in an increase in the production cost.

For example, if the power-supply voltage is stable, a comparative potential of a comparator can be provided by resistive division using two resistors. However, when the power-supply voltage fluctuates, it is necessary to provide a band-gap voltage source.

Although, in the foregoing description, a driver circuit using CMOS transistors has been illustrated, the same problems also arise when bipolar transistors or Bi(bipoler) CMOS devices are used.

In the case of using bipolar transistors, the influence on the reliability when breakdown between the collector and the emitter occurs is smaller than when using CMOS devices. However, since the driving capability of bipolar transistors is larger, the influence on other circuits at switching is larger.

SUMMARY OF THE INVENTION

It is an object of the present invention to provide an integrated circuit including a circuit requiring high-speed and/or large-current driving, in which a decrease in the reliability due to a parasitic inductance caused by the package of the integrated circuit, bonding wires and the like is prevented so as to be able to utilize a power-supply voltage to a value closer to a breakdown voltage of devices.

It is another object of the present invention to provide an integrated circuit which can prevent a misoperation in circuits caused by variations in a power-supply voltage due to the influence of the above-described parasitic inductance.

According to one aspect, the present invention which achieves these objectives relates to a semiconductor integrated circuit including a circuit for performing switching, and a series circuit, including at least one resistance and at least one capacitance, disposed so as to be adjacent to the circuit and provided between a high-voltage-sided interconnection and a low-voltage-side interconnection of a power-supply voltage for the circuit.

The capacitance in the series circuit (RC series circuit) including the resistance and the capacitance within the above-described integrated circuit operates so as to supply the high-voltage power-supply line and the lowvoltage power-supply line (for example, a ground line) connected to the circuit performing switching (particularly, a circuit performing high-speed and/or large-current switching) with electric charges, to reduce the amount of change of current in the parasitic inductance, and to reduce an inverse electromotive force generated in the parasitic inductance. The resistance in the RC series circuit operates so as to prevent resonance by the parasitic inductances and the capacitance.

The semiconductor integrated circuit of the present invention includes another circuit which does not perform switching, and a high-voltage-side interconnection and a low-voltage-side interconnection of the power-supply voltage for the other circuit are electrically separated from the high-voltage-side interconnection and the low-voltage-side interconnection of the power-supply voltage for the switching circuit. The circuit which does not perform switching indicates a circuit which does not perform switching at all, or a circuit which performs switching but in which influence by voltage variations due to the parasitic inductance are negligible even if switching is performed. That is, by electrically'separating the high-voltage-side interconnection and the low-voltage-side interconnection of the powersupply voltage for the other circuit which does not perform switching from the high-voltage-side interconnection and the low-voltage-side interconnection of the power-supply voltage for the switching circuit, the switching circuit does not influence other circuits.

Furthermore, in the semiconductor integrated circuit of the present invention, by disposing the series circuit including at least one resistance and at least one capacitance at a position closest to a high-voltage-side bonding pad and a low-voltage-side bonding pad for supplying the integrated circuit with the power-supply voltage, between the high-voltage-side interconnection and the low-voltage-side interconnection for supplying respective circuits constituting the integrated circuit with the power-supply voltage. That is, by providing the RC series circuit at a position closest to the bonding pads for supplying the power-supply voltage than the circuit performing high-speed and/or large-current switching and other circuits, a current which is not absorbed by the RC series circuit in the current caused by switching by the switching circuit (particularly, the circuit performing high-speed and/or large-current switching) and voltage variations due to a parasitic resistance caused by the interconnections within the integrated circuit are minimized.

In the semiconductor integrated circuit of the present invention, by setting the values of the resistance and the capacitance constituting the RC series circuit to values so that the LCR series circuit comprising the parasitic inductance and the parasitic resistance does not oscillate, it is possible to prevent the possibility that the power-supply voltage oscillates due to introduction of the RC series circuit.

The foregoing and other objects, advantages and features of the present invention will become more apparent from the following description of the preferred embodiments taken in conjunction with the accompanying drawings.

BRIEF DESCRIPTION OF THE DRAWINGS

FIG. 1 is a schematic circuit diagram illustrating a driving circuit;

FIG. 2(A) is a schematic plan view illustrating a configuration in which a capacitance and a resistance are connected in series;

FIG. 2(B) is a schematic cross-sectional view taken along line IB—IB shown in FIG. 2(A);

FIG. 3 is a schematic circuit diagram illustrating an integrated circuit;

FIGS. 4(A) through 4(D) are graphs illustrating variations in voltages at respective portions;

FIG. 5 is a graph illustrating an example of characteristics of a transistor;

FIGS. 10(A) through 10(C) are graphs illustrating variations in voltages at respective portions;

DESCRIPTION OF THE PREFERRED EMBODIMENTS

Preferred embodiments of the present invention will now be described in detail with reference to the drawings.

First Embodiment

Figure 6:
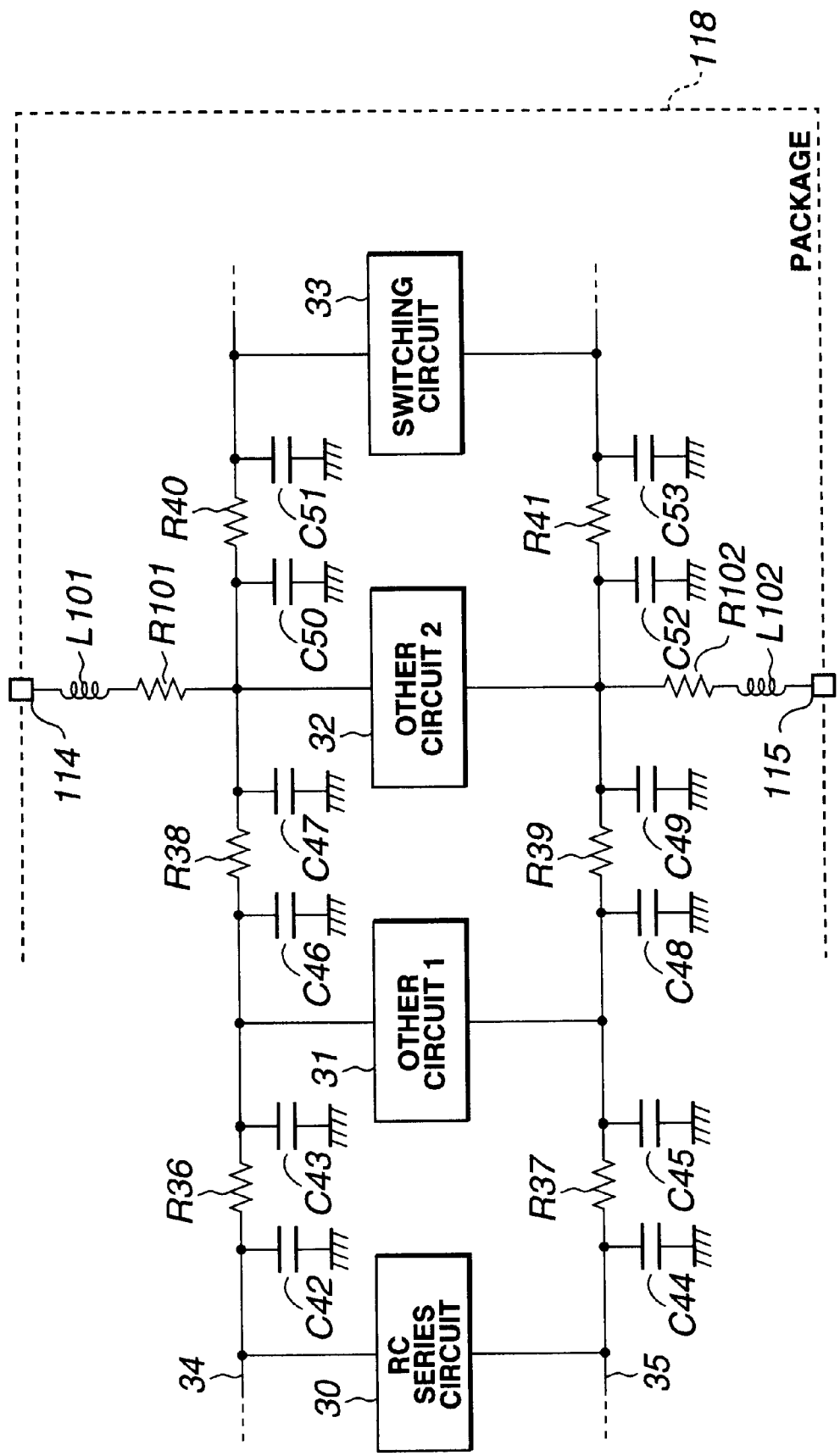
FIG. 6 is a schematic circuit diagram illustrating another integrated circuit.
Figure 7:
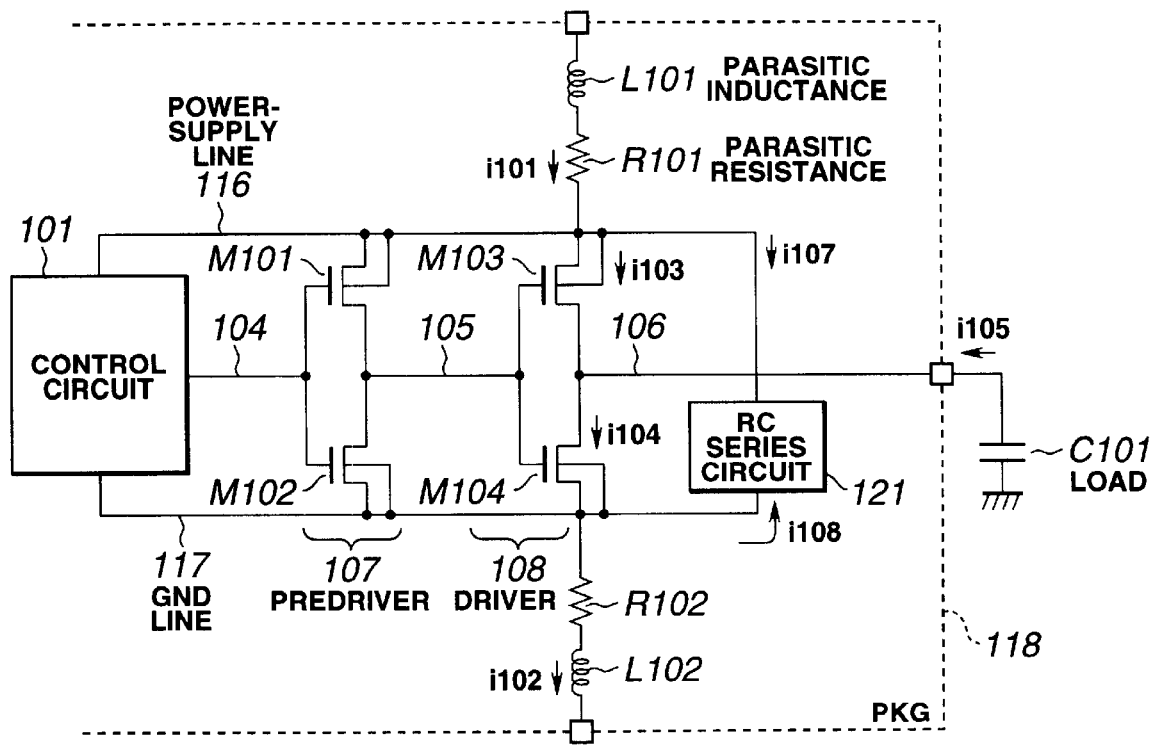
FIG. 7 is a schematic circuit diagram illustrating still another integrated circuit.

FIG. 7 is a schematic equivalent circuit diagram illustrating the configuration of a semiconductor integrated circuit according to a first embodiment of the present invention. In FIG. 7, the same components or signals as those shown in FIG. 3 are indicated by the same reference numerals, and a further description thereof will be omitted.

Figures 8A, 8B, 8C:
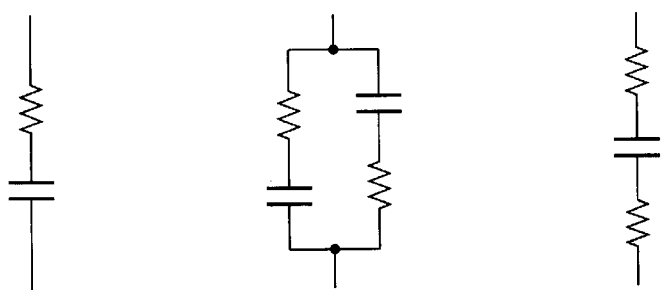
FIGS. 8(A) through 8(C) are diagrams, each illustrating an RC series circuit.

As shown in FIG. 7, the semiconductor integrated circuit of the first embodiment differs from the semiconductor integrated circuit shown in FIG. 3 in that at least one RC series circuit 121 is provided adjacent to a circuit performing high-speed and/or large-current switching between the power-supply line 116 and the ground line 117 on the semiconductor substrate. FIGS. 8(A) through 8(C) illustrate specific examples of RC series circuits. FIG. 8(A) is a simple RC series circuit; FIG. 8(B) is a circuit in which a circuit obtained by inverting the RC series circuit shown in FIG. 8(A) is connected in parallel with the RC series circuit; and FIG. 8(C) is a circuit in which the resistor shown in FIG. 8(A) are divided into two portions which are disposed above and under the capacitor.

Figure 9:
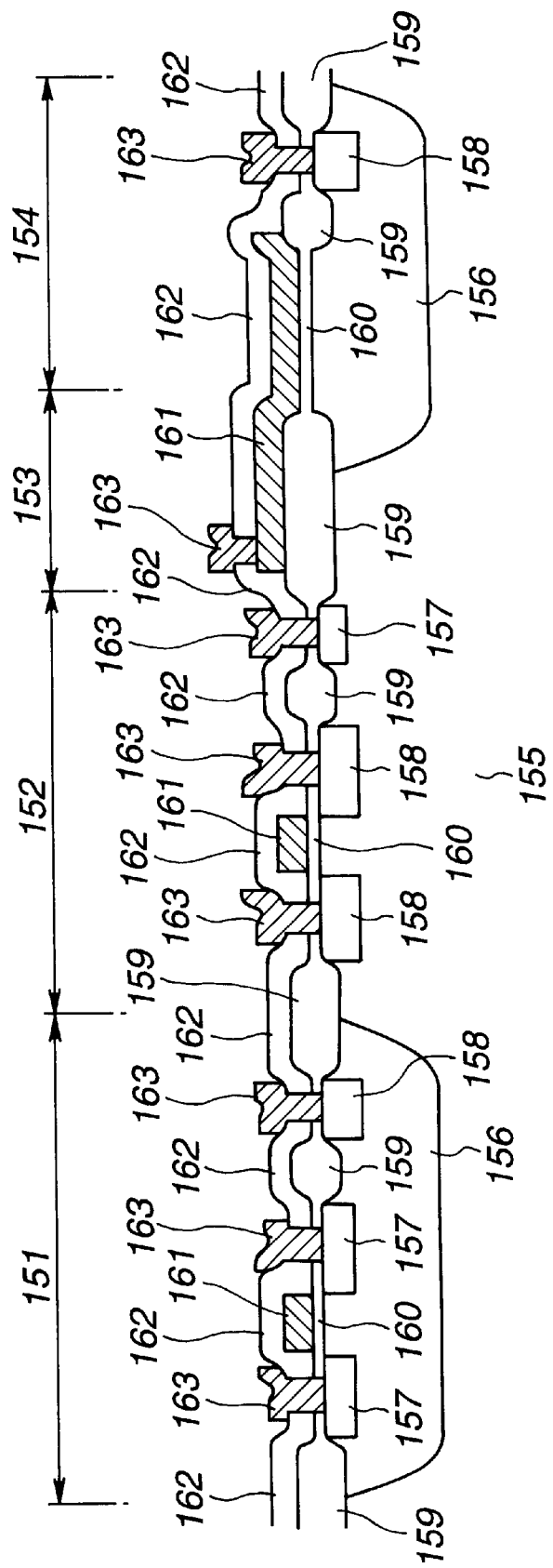
FIG. 9 is a schematic cross-sectional view illustrating the configuration of a semiconductor device comprising an integrated circuit.

FIG. 9 illustrates a device for realizing the first embodiment. FIG. 9 is a schematic cross-sectional view from a substrate to a first metal interconnection layer when an integrated circuit comprises a CMOS circuit. In FIG. 9, a layer of channel doping for adjusting the threshold voltage of MOS transistors, and a layer of channel stop for preventing the formation of an inversion layer on the surface of the substrate are omitted, since these layers are not related to the essence of the description. There are shown an n-type semiconductor substrate 155, and p-type wells 156. Reference numeral 157 represents n$^+$ diffusion for providing the source and the drain of each n-MOS transistor, and for obtaining substrate contact of the n-type substrate. Reference numeral 158 represents p$^+$ diffusion for providing the source and the drain of each p-MOS transistor, and for obtaining well contact of the p-type well. There are also shown a thick oxide film 159 for element separation, an oxide film 160 for forming a capacitance with a gate oxide film of each MOS transistor, an interlayer insulating film 161, a polysilicon film 162 constituting the gate of each MOS transistor and one electrode of each of a resistance and a capacitance, and a first layer metal interconnection 163. There are also shown an nMOS region 151, a pMOS region 152, a resistance region 153, and a capacitance region 154. The regions 153 and 154 constitute the above-described RC series circuit. An important point in the configuration shown in FIG. 9 is that the RC series circuit is configured by the same members as those constituting CMOS transistors which constitute the integrated circuit. Accordingly, the RC series circuit can be provided without increasing the number of processes. The configuration of the resistance and the capacitance using the same members as those constituting the CMOS transistors is not limited to the above-described one. For example, a p$^+$ or n$^+$ diffused resistance may be used, and a capacitance using a layer film provided between a polysilicon film and a metal film may be used. A known method may be used for manufacturing these elements. Hence, a description thereof will be omitted.

The effects of the RC series circuit in the first embodiment will now be described with reference to FIGS. 10(A) through 10(C). As in the case of FIGS. 4(A) through 4(D), for the purpose of simplifying description, variations in voltages in the power-supply lines when the output 105 of the predriver changes will be described.

When the output 105 of the predriver assumes a Low level (at T$_0$ shown in FIG. 10(A)), the pMOS transistor M103 is in an on-state, and the nMOS transistor M104 is in an off-state, and the load C101 is charged to the power-supply voltage. When the output 105 of the predriver starts to change to a High level (at T$_1$ shown in FIG. 10(A)), the nMOS transistor M104 is turned on, and a passing current i104 and a current i105 as a result of discharge from the load C101 flow through the. nMOS transistor M104. In the first embodiment, however, a current i108 which is a part of the current i104, is used for charging the capacitance of the RC series circuit 121, and the remaining current flows to the outside ground via the parasitic inductance L102 (i102= i104–i108). Accordingly, the inverse electromotive force generated in the parasitic inductance L102 becomes smaller than in the case shown in FIGS. 4(A) and 4(D), so that voltage variations in the ground line 117 within the semiconductor substrate are suppressed.

Similarly, a passing current i103 flows through the pMOS transistor M103. However, since a part of the passing current i103 is supplied from the RC series circuit 121 (i107), the current (i101) flowing through the parasitic inductance L101 is smaller than in the case shown in FIG. 3 (i101=i103–i107), the inverse electromotive force decreases, and voltage variations in the power-supply line 116 is suppressed as compared to when the RC series circuit is absent (indicated by broken lines in FIG. 10(C)), so that the problems of decrease in reliability and bad influence on other circuits are ameliorated.

In this case, the inverse electromotive force generated in the parasitic inductance decreases even if the RC series circuit 121 comprises only the capacitance. However, since there is a possibility of resonance occuring due to the capacitance and the parasitic inductance, which, in some cases, increases power consumption due to the parasitic resistance, and to causes oscillation of voltages in the power-supply line and the ground line, thereby causing instability in the output voltage 106, it is desirable to provide a resistance.

Since the value of a parasitic inductance L$_p$ and the value of a parasitic resistance R$_p$ caused by a portion from the power-supply source of the integrated circuit to the high-voltage-side interconnection or the low-voltage-side interconnection of the power-supply voltage for the switching circuit (for example, a portion from the power-supply source of the integrated circuit to the high-voltage-side interconnection or the low-voltage-side interconnection for the switching circuit via the substrate, and leads and bonding wires of the package) influence the operation of the RC series circuit, it is desirable that the values of the resistance R and the capacitance C of the RC series circuit satisfy the following condition of nonoscillation for the LCR series circuit:

$$C \geq 4L_p/(R_p+R)^2 \quad (1),$$

where L$_p$ is the value of the parasitic inductance, and R$_p$ is the value of the parasitic resistance present in series. For example, in the semiconductor integrated circuit shown in FIG. 7, L$_p$=L101, and R$_p$=R101 at the high voltage side, and L$_p$=L102, and R$_p$=R102 at the low voltage side. It is desirable that the values of the resistance R and the capacitance C of the RC series circuit are set so that the above-described relation (1) holds for one of the high voltage side and the low voltage side (i.e., $C \geq 4L101/(R101+R)^2$ or $C \geq 4L102/(R102+R)^2$), and more preferably, so that the equation (1) holds for both of the high voltage side and the low voltage side (i.e., $C \geq 4L101/(R101+R)^2$ and $C \geq 4L102/(R102+R)^2$).

Furthermore, it is more effective that the RC series circuit disposed adjacent to the circuit performing high-speed and/ or large-current switching is disposed at a position closest to bonding pads for supplying the integrated circuit with the power-supply voltage than other circuits for realizing the function of the integrated circuit (except a circuit for protecting electrostatic breakdown).

Figure 11A:
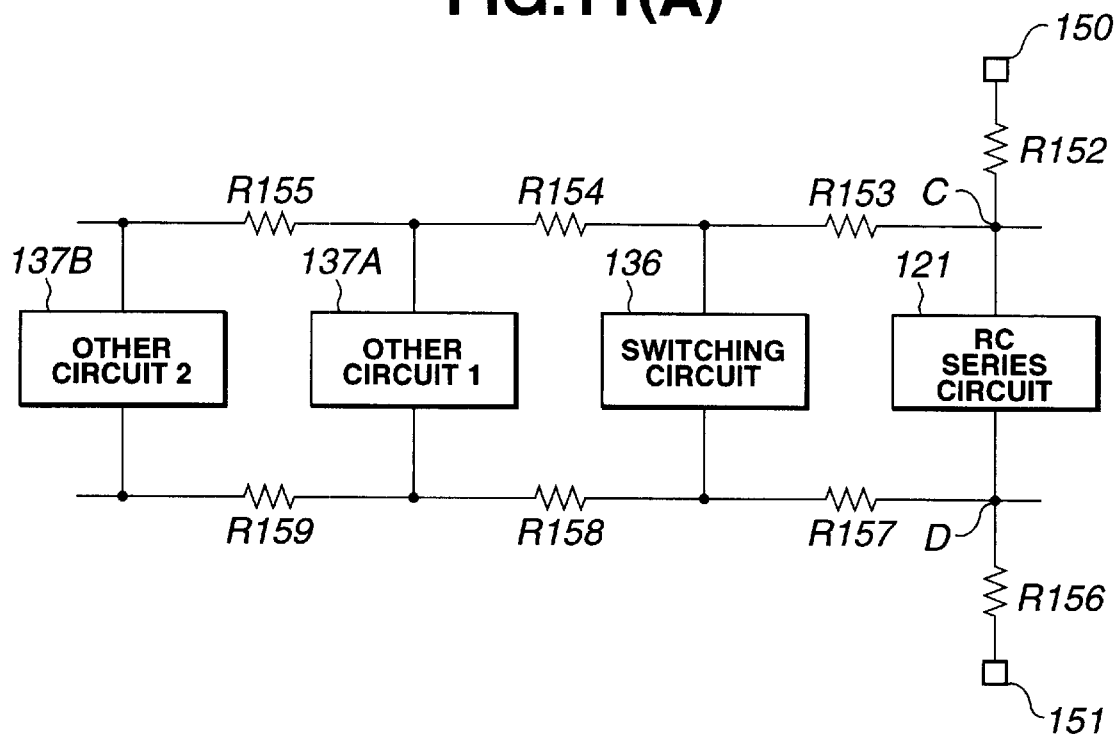
FIGS. 11(A) and 11(B) are schematic circuit diagrams, each illustrating the layout of an RC series circuit.
Figure 11B:
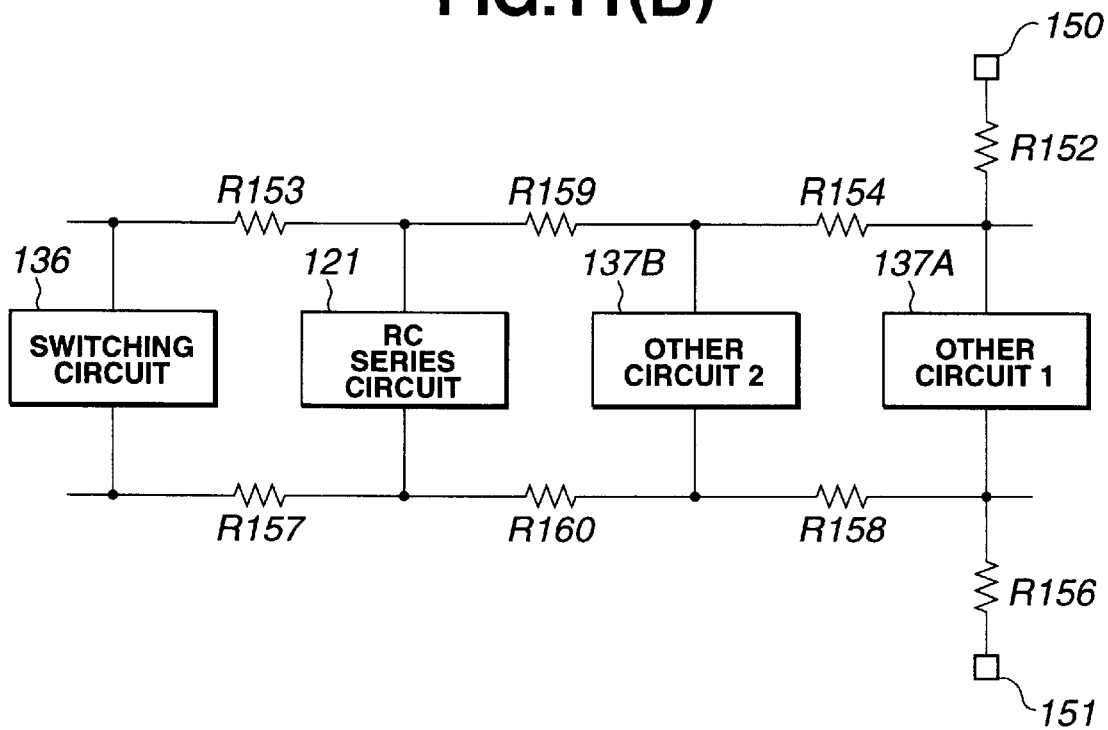

This requirement will now be described with reference to FIGS. 11(A) and 11(B). As schematically illustrated in FIG. 11(A), when a circuit 136 performing high-speed and/or large-current switching disposed adjacent to the RC series circuit 121 is placed at a position closer to bonding pads 150 and 151 for supplying the power-supply voltage than other circuits 137A and 137B, a parasitic inductance caused by power-supply interconnections on the semiconductor substrate is smaller than when the switching circuit 136 is disposed at a position separated from the bonding pads for supplying the power-supply voltage on the semiconductor substrate as shown in FIG. 11(B). Accordingly, voltage variations caused by switching (proportional to the value of the parasitic inductance) before inserting the RC series circuit can be further reduced.

Furthermore, even if there is a portion of the switching current which is not absorbed by the RC series circuit, parasitic resistances between the RC series circuit 121 and the circuit 136 performing high-speed and/or large-current switching disposed adjacent thereto, and the bonding pads 150 and 151 for supplying the power-supply voltage on the semiconductor substrate can be smaller than in other arrangements. Accordingly, the amounts of a current I1 (at the power supply side) and a current I2 (at the ground side) which are not absorbed by the RC series circuit 121 in the switching current, and the voltage drop produced by the parasitic resistances of the power-supply interconnections on the semiconductor substrate are reduced, thereby reducing variations in the power-supply voltage in other circuits.

In the case shown in FIG. 11(A), variations V1 (at the power supply side) and V2 (at the ground side) in the power-supply voltage for the other circuit 137B are expressed by:

$$V1=I1\times(R152+R153)\div I1\times R152$$

$$V2=I2\times(R156+R157)\div I2\times R156.$$

(Note: The currents I1 and I2 do not flow in the resistances R154, R155, R158 and R159, and R153÷0, and R157÷0 because they are disposed adjacent to the bonding pads.)

On the other hand, in the case shown in FIG. 11(B), in which the other circuits 137A and 137B are disposed between the circuit 136 performing high-speed and/or large-current switching disposed adjacent to the RC series circuit 121, and the bonding pads for supplying the power-supply voltage on the semiconductor substrate, variations V3 (at the power supply side) and V4 (at the ground side) in the power-supply voltage in the other circuit 137B are expressed by:

$$V3=I1\times(R152+R154)$$

$$V4=I2\times(R156+R158).$$

Since V1<V3, and V2<V4, the above-described second effect is apparent.

A protection circuit for electrostatic breakdown is generally placed close to the bonding pads. It is rational to place the protective circuit closer to the bonding pads, because parasitic inductances caused by the power-supply interconnections on the semiconductor substrate can be reduced, and, in some cases, it is necessary to protect the RC series circuit.

Although the case of using MOS transistors has been described, the same effects may also be obtained when using bipolar transistors or a BiCMOS circuit.

Although a description has been provided illustrating a case in which a positive power supply and the ground are used as the power supply at the high voltage side and the power supply at the low voltage side, respectively, a positive power supply and a negative power supply, or the ground and a negative supply may also be used.

Although, in the first embodiment, a single RC series circuit is shown in each of FIGS. 8(A) through 8(C), a plurality of RC series circuits may, of course, be connected in parallel depending on pattern layout or adjustment.

Second Embodiment

In the first embodiment, the case of reducing voltage variations in the power-supply line and the ground line by inserting an RC series circuit adjacent to a circuit performing high-speed and/or large-current switching between the power-supply line and the ground line. However, since changes in currents flowing in parasitic inductances cannot be completely removed, a part of voltage variations in the power-supply line and the ground line for other circuit blocks remains by being influenced by the circuit block performing high-speed and/or large-current switching, so that the possibility of causing a misoperation in other circuit blocks is not completely removed.

Figure 12:
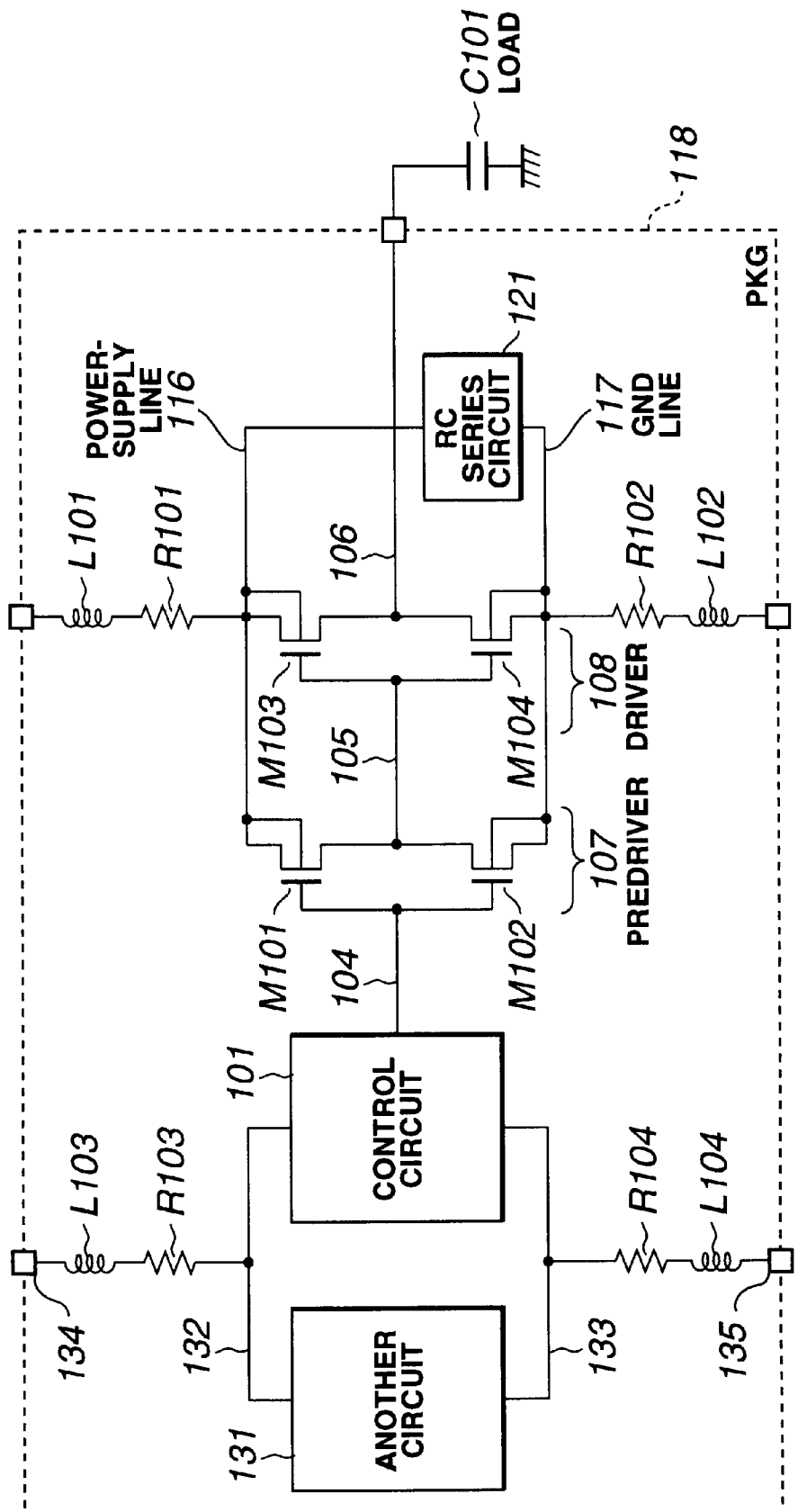
FIG. 12 is a schematic circuit diagram illustrating still another integrated circuit.

In a second embodiment of the present invention shown in FIG. 12, the power-supply line and the ground line of a circuit block performing high-speed and/or large current switching are electrically separated from the power-supply line and the ground line of other circuit blocks, so that switching by the switching circuit does not influence the other circuits. Furthermore, as in the first embodiment, an RC series circuit is connected between the power-supply line and the ground line for the switching circuit, so that the reliability of devices constituting a driver circuit is not degraded.

That is, in the second embodiment, as shown in FIG. 12, a power-supply line 116 and a ground line 117 for a driver and a predriver are electrically separated from an power-supply line 132 and a ground line 133 for a control circuit 101 and another circuit 131. The another circuit 131 is a circuit which does not include a circuit performing high-speed and large-current switching integrated on the same substrate. L103 and R103 represent a parasitic inductance and a parasitic resistance, respectively, caused by a bonding wire and a lead frame for connecting the power-supply line 132 to a power-supply pin 134 of the package of the integrated circuit. L104 and R104 are a parasitic inductance and a parasitic resistance, respectively, caused by a bonding wire and a lead frame for connecting the ground line 133 to a ground pin 135 of the package. The values of the parasitic inductances L103 and L104 are substantially the same as the values of the parasitic inductances L101 and L102. However, since these inductances L103 and L104 are connected to the power-supply line and to the ground line, respectively, other than those of the circuit block performing large-current switching, an inverse electromotive force generated by these inductances is small, so that a misoperation due to voltage variations in the ground line can be prevented, without having to accept the increase in production cost that would be involved with adoption of a complicated circuit block having an excellent PSRR.

Since reduction in voltage variations in the power-supply line and the ground line for the predriver and the driver when using the RC series circuit is the same as in the first embodiment, a description thereof will be omitted.

In the second embodiment, a case of using a single circuit block for performing high-speed and large-current switching has been described. When using a plurality of such circuit blocks, a power-supply line and a ground line which are common to these circuit blocks may be used, and at least one RC series circuit may be provided between the power-supply line and the ground line. Alternatively, in order to prevent interference between these circuit blocks, a power-supply line and a ground line may be separately provided for each of the circuit blocks, and at least one RC series circuit may be provided between the power-supply line and the ground line.

Although a description has been provided illustrating a case in which a positive power supply and the ground are used as the power supply at the high voltage side and the power supply at the low voltage side, respectively, a positive power supply and a negative power supply, or the ground and a negative supply, may also be used.

Although, in the second embodiment, a single RC series circuit has been illustrated, a plurality of RC series circuits may, of course, be connected in parallel depending on pattern layout or adjustment.

As described above, according to the present invention, the following effects can be obtained.

(1) By connecting a series circuit comprising at least one resistance and one capacitance at a position adjacent to a circuit performing high-speed and/or large-current switching, such as a driver circuit or the like, between a high-voltage-side interconnection and a low-voltage-side interconnection of a power-supply voltage for an integrated circuit including the switching circuit, it is possible to suppress voltage variations in a power-supply line, and a ground line or a negative power-supply line due to parasitic inductances of bonding wires and the lead frame of the package, to prevent application of an excessive voltage to devices within the integrated circuit, and to prevent a decrease in the reliability of the devices. Furthermore, it is unnecessary to provide a large margin between the power-supply voltage and the breakdown voltage of each device, and it is possible to use high-performance devices of a higher degree of integration, and to improve the performance and to realize a low cost because of an increase in the production yield.

(2) By electrically separating interconnections for providing a driver circuit performing high-speed and/or large-current switching with a high power-supply voltage and a low power-supply voltage from interconnections for providing other circuits with the high power-supply voltage and the low power-supply voltage, it is possible to prevent a mis-operation in the other circuits due to voltage variations in a power-supply line, and a ground line or a negative power-supply line caused by switching and parasitic elements, thus making it unnecessary to use a complicated circuit configuration having a higher PSRR for the other circuits, reducing the scale and the production cost of the circuits. In the circuit performing high-speed and/or large-current switching, by connecting an RC series circuit between the high-voltage power-supply interconnection and the low-voltage power-supply interconnection, the same effects as in the above-described item (1) is obtained.

Furthermore, by disposing the RC series circuit at a position closest to a high-voltage-side bonding pad and a low-voltage side bonding pad for supplying the integrated circuit with a power-supply voltage between a high-voltage-side interconnection and a low-voltage-side interconnection for supplying respective circuits constituting the integrated circuit with the power-supply voltage, it is possible to suppress variations in the power-supply voltage due to a parasitic resistance and switching current, and so to enhance the effects of the above-described item (1).

In addition, by selecting the values of the resistance and the capacitance of the RC series circuit with respect to the values of the parasitic inductance and the parasitic resistance so as to satisfy the condition of expression (1), it is possible to prevent resonance, to suppress an unnecessary increase in power consumption, and to stabilize output waveforms.

The individual components shown in outline or designated by blocks in the drawings are all well-known in the semiconductor integrated circuit arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor integrated circuit, comprising:
    a semiconductor circuit substrate which includes:
        a high-voltage-side line for supplying a high voltage;
        a low-voltage-side line for supplying a low voltage;
        a driver circuit connected to said high-voltage-side line and said low-voltage-side line so as to be supplied with a power voltage therefrom, for switching; and
        a series circuit of a resistance and a capacitor connected between said high-voltage-side line and said low-voltage-side line; and
    a package encapsulating said semiconductor circuit substrate and having a high-voltage-side input terminal and a low-voltage-side input terminal,
    wherein, representing by $L_p$ the parasitic inductance between said high-voltage-side input terminal and said high-voltage-side line or the parasitic inductance between said low-voltage-side input terminal and said low-voltage-side line and representing also by $R_p$ the parasitic resistance between said high-voltage-side input terminal and said high-voltage-side line or the parasitic resistance between said low-voltage-side input terminal and said low-voltage-side line, a value R of said resistance and a value C of said capacitance of said series circuit are determined to meet the following conditions, for each of the high-voltage side and the low-voltage side:

$$C \geq 4L_p/(R+R_p)^2.$$

2. A semiconductor integrated circuit, comprising:
    a semiconductor circuit substrate which includes:
        a high-voltage-side line for supplying a high voltage;
        a low-voltage-side line for supplying a low voltage;
        a driver circuit connected to said high-voltage-side line and said low-voltage-side line so as to be supplied with a power voltage therefrom, for effecting switching;
        a series circuit of a resistance and a capacitor connected between said high-voltage-side line and said low-voltage-side line;
        another high-voltage-side line independent from said high-voltage-side line, for supplying said high voltage;
        another low-voltage-side line independent from said low-voltage-side line, for supplying said low voltage; and
        a control circuit connected to said other high-voltage-side line and said other low-voltage-side line so as to be supplied with the power voltage therefrom, for driving said driver circuit; and
    a package encapsulating said semiconductor circuit substrate and having a plurality of high-voltage-side input terminals and a plurality of low-voltage-side input terminals;
    wherein, representing by Lp the parasitic inductance between one of said high-voltage-side input terminals and the high-voltage-side line connected thereto or the parasitic inductance between one of said low-voltage-side input terminals and the low-voltage-side line connected thereto and representing also by Rp the parasitic resistance between one of said high-voltage-side input terminals and the high-voltage-side line connected thereto or the parasitic resistance between one of said low-voltage-side input terminals and said low-voltage-side line connected thereto, the value R of said resistance and the value C of said capacitance of said series circuit are determined to meet the following conditions, for each of the high-voltage side and the low-voltage side:

$C \geq 4Lp/(R+Rp)^2$.

* * * * *

UNITED STATES PATENT AND TRADEMARK OFFICE
CERTIFICATE OF CORRECTION

PATENT NO. : 6,353,353 B1
DATED : March 5, 2002
INVENTOR(S) : Toshiki Nakayama

It is certified that error appears in the above-identified patent and that said Letters Patent is hereby corrected as shown below:

Column 2,
Line 61, "neglible" should read -- negligible --.

Column 4,
Line 51, "Bi(bipoler)" should read -- Bi(bipolar) --.

Column 5,
Line 10, "high-voltage-sided" should read -- high-voltage-side --;
Line 16, "lowvoltage" should read -- low-voltage --; and
Line 38, "powersup-" should read -- power-sup- --.

Column 6,
Line 16, "line IB-IB" should read -- line 2B-2B --.

Column 8,
Line 13, "to" should be deleted; and
Line 43, "equation (1) " should read -- relation (1) --.

Column 9,
Line 56, "supply" should read -- power supply --.

Column 10,
Line 21, "an" should read -- a --.

UNITED STATES PATENT AND TRADEMARK OFFICE
CERTIFICATE OF CORRECTION

PATENT NO.    : 6,353,353 B1
DATED         : March 5, 2002
INVENTOR(S)   : Toshiki Nakayama It is certified that error appears in the above-identified patent and that said Letters Patent is hereby corrected as shown below:

<u>Column 12,</u>
Line 22, "$L_p$" should read -- $L_p$ --; and
Line 27, "$R_p$" should read -- $R_p$ --.

Signed and Sealed this

Sixteenth Day of July, 2002

*Attest:*

*Attesting Officer*

JAMES E. ROGAN
*Director of the United States Patent and Trademark Office*